(12) United States Patent
Hung et al.

(10) Patent No.: US 9,870,996 B1
(45) Date of Patent: Jan. 16, 2018

(54) SEMICONDUCTOR DEVICE AND METHOD OF FABRICATING THE SAME

(71) Applicant: UNITED MICROELECTRONICS CORP., Hsin-Chu (TW)

(72) Inventors: Ching-Wen Hung, Tainan (TW); Chih-Sen Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/247,948

(22) Filed: Aug. 26, 2016

(30) Foreign Application Priority Data

Aug. 8, 2016 (CN) .......................... 2016 1 0640986

(51) Int. Cl.
| | | |
|---|---|---|
| *H01L 21/8234* | (2006.01) | |
| *H01L 23/535* | (2006.01) | |
| *H01L 27/088* | (2006.01) | |
| *H01L 27/02* | (2006.01) | |
| *H01L 21/768* | (2006.01) | |
| *H01L 29/423* | (2006.01) | |

(52) U.S. Cl.
CPC ...... *H01L 23/535* (2013.01); *H01L 21/76895* (2013.01); *H01L 21/823437* (2013.01); *H01L 21/823475* (2013.01); *H01L 27/0207* (2013.01); *H01L 27/088* (2013.01); *H01L 29/42356* (2013.01)

(58) Field of Classification Search
CPC . H01L 23/535; H01L 27/088; H01L 27/0207; H01L 29/42356; H01L 21/823475; H01L 21/823437; H01L 21/76895; H01L 21/76816; H01L 23/49838; H01L 23/528; H01L 23/5286; H01L 27/11504; H01L 27/11519
See application file for complete search history.

(56) References Cited

U.S. PATENT DOCUMENTS

| | | | |
|---|---|---|---|
| 7,983,072 B2 | 7/2011 | Inaba | |
| 2003/0107094 A1* | 6/2003 | Kim | .............. H01L 21/28123 257/401 |
| 2004/0127050 A1* | 7/2004 | Park | .............. H01L 21/76895 438/692 |

(Continued)

OTHER PUBLICATIONS

Wang, Title of Invention: Layout Pattern for SRAM and Manufacturing Methods Thereof, U.S. Appl. No. 15/088,122, filed Apr. 1, 2016.

(Continued)

*Primary Examiner* — Bitew Dinke
(74) *Attorney, Agent, or Firm* — Winston Hsu (57) ABSTRACT

A semiconductor device and a method of fabricating the same are provided. The semiconductor device includes a substrate, a plurality of gates and a plurality of plugs. The gates are disposed on the substrate and extend in a first direction. The gates include a first gate and a second gate. The first gate includes a first protruding portion extending in a second direction. The plugs are disposed parallel to one another on the substrate. The plugs include a first plug and a second plug. The first plug and the second plug cover the first gate and the second gate respectively. A central axis of the first plug is shifted from a central axis of the first gate toward the second direction, and a central axis of the second plug is shifted from a central axis of the second gate toward the second direction.

13 Claims, 5 Drawing Sheets

(56) References Cited

U.S. PATENT DOCUMENTS

| | | | | |
|---|---|---|---|---|
| 2007/0241365 A1* | 10/2007 | Iwamatsu | ........... | H01L 27/0207 257/147 |
| 2009/0085118 A1* | 4/2009 | Hong | ................. | H01L 27/0207 257/365 |
| 2013/0021839 A1* | 1/2013 | Ishikura | ................ | G11C 11/412 365/154 |
| 2013/0037888 A1* | 2/2013 | Han | ................ | H01L 21/823456 257/396 |
| 2013/0113112 A1* | 5/2013 | Tamaru | ............. | H01L 21/76895 257/774 |
| 2013/0329487 A1* | 12/2013 | Asayama | .............. | G11C 11/419 365/154 |
| 2014/0035056 A1* | 2/2014 | Liaw; Jhon-Jhy | .... | G11C 11/412 257/369 |
| 2014/0241027 A1* | 8/2014 | Hung | .................... | G11C 11/412 365/72 |
| 2014/0252653 A1* | 9/2014 | Okamoto | ............ | H01L 27/0207 257/774 |
| 2016/0307882 A1* | 10/2016 | Chen | .................. | H01L 27/1104 |
| 2017/0018302 A1* | 1/2017 | Yin | ....................... | G11C 11/412 |

OTHER PUBLICATIONS

Wang, Title of Invention: Electronic Circuit of Fin FET and Methof for Fabricating the Electronic Circuit, U.S. Appl. No. 15/140,019, filed Apr. 27, 2016.

* cited by examiner

SEMICONDUCTOR DEVICE AND METHOD OF FABRICATING THE SAME

BACKGROUND OF THE INVENTION

1. Field of the Invention

The present invention relates to a semiconductor device and a method of manufacturing the same, and more particularly, to a semiconductor device including metal gates and plug structures and a method of fabricating the same.

2. Description of the Prior Art

With the trend towards scaling down the critical dimension (CD) in semiconductor processes, conventional arts are miniaturizing the size of semiconductor devices, but have faced many problems in the integrated process of the semiconductor structure including metal gates, especially when the CD is miniaturized to a certain degree.

In order for a miniaturized semiconductor device to achieve a highly integrated and high-speed operation, conventional arts utilize miniaturized through holes and interlayer dielectric layers to form a multilayered interconnected wiring structure for being electrically connected to the metal gate and the source/drain of the transistor respectively and being the input/output ends for imported electrical signals. However, conventional arts still face many problems in the integrated process of the metal gates and other units, such as contact plugs, because of optical limitations. For example, the entire electric performance of the semiconductor device will be seriously affected when the contact plugs for being electrically connected to the gates and the source/drain regions are not formed properly at the predetermined locations. Accordingly, it is very important to figure out the ways for improving the manufacturing process and the structure of the semiconductor devices.

SUMMARY OF THE INVENTION

It is one of the objectives of the present invention to provide a method of fabricating a semiconductor device for optimizing the dispositions of the plugs and the metal gates effectively. The semiconductor devices with enhanced reliability may be obtained accordingly.

It is one of the objectives of the present invention to provide a semiconductor device, and a coverage ratio between each plug and a corresponding metal gate in the semiconductor device may be higher than or equal to 70%. The device reliability of the semiconductor device may be effectively enhanced accordingly.

To achieve the purposes described above, a method of fabricating a semiconductor device is provided in one embodiment of the present invention. The method includes the following steps. A substrate is provided first. A plurality of gates are formed on the substrate. The gates extend in a first direction, and the gates include a first gate and a second gate. The first gate includes a first protruding portion, and the first protruding portion extends in a second direction. A plurality of plugs are then formed parallel with one another on the substrate. The plugs include a first plug and a second plug. The first plug and the second plug cover the first gate and the second gate respectively. A central axis of the first plug is shifted from a central axis of the first gate toward the second direction, and a central axis of the second plug is shifted from a central axis of the second gate toward the second direction.

To achieve the purposes described above, a semiconductor device is provided in one embodiment of the present invention. The semiconductor device includes a substrate, a plurality of gates, and a plurality of plugs. The gates are disposed on the substrate and extend in a first direction. The gates include a first gate and a second gate. The first gate includes a first protruding portion, and the first protruding portion extends in a second direction. The plugs are disposed parallel with one another on the substrate. The plugs include a first plug and a second plug. The first plug and the second plug cover the first gate and the second gate respectively. A central axis of the first plug is shifted from a central axis of the first gate toward the second direction, and a central axis of the second plug is shifted from a central axis of the second gate toward the second direction.

In the method of forming the semiconductor device of the present invention, protruding portions with different sizes are formed at the left side or the right side of each of the gates in accordance with shifting directions and shifting distance of the plugs formed subsequently for being electrically connected to the gates. The coverage ratio of the plugs covering the corresponding gates may be enhanced, and the coverage ratio of the plugs may be higher than or equal to 70% accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 and FIG. 2 are schematic drawings illustrating a method of fabricating a semiconductor device according to a first embodiment of the present invention, wherein

DETAILED DESCRIPTION

To provide a better understanding of the present invention to users skilled in the technology of the present invention, embodiments are detailed as follows. The embodiments of the present invention are illustrated in the accompanying drawings with numbered elements to clarify the contents and effects to be achieved.

Figure 1:
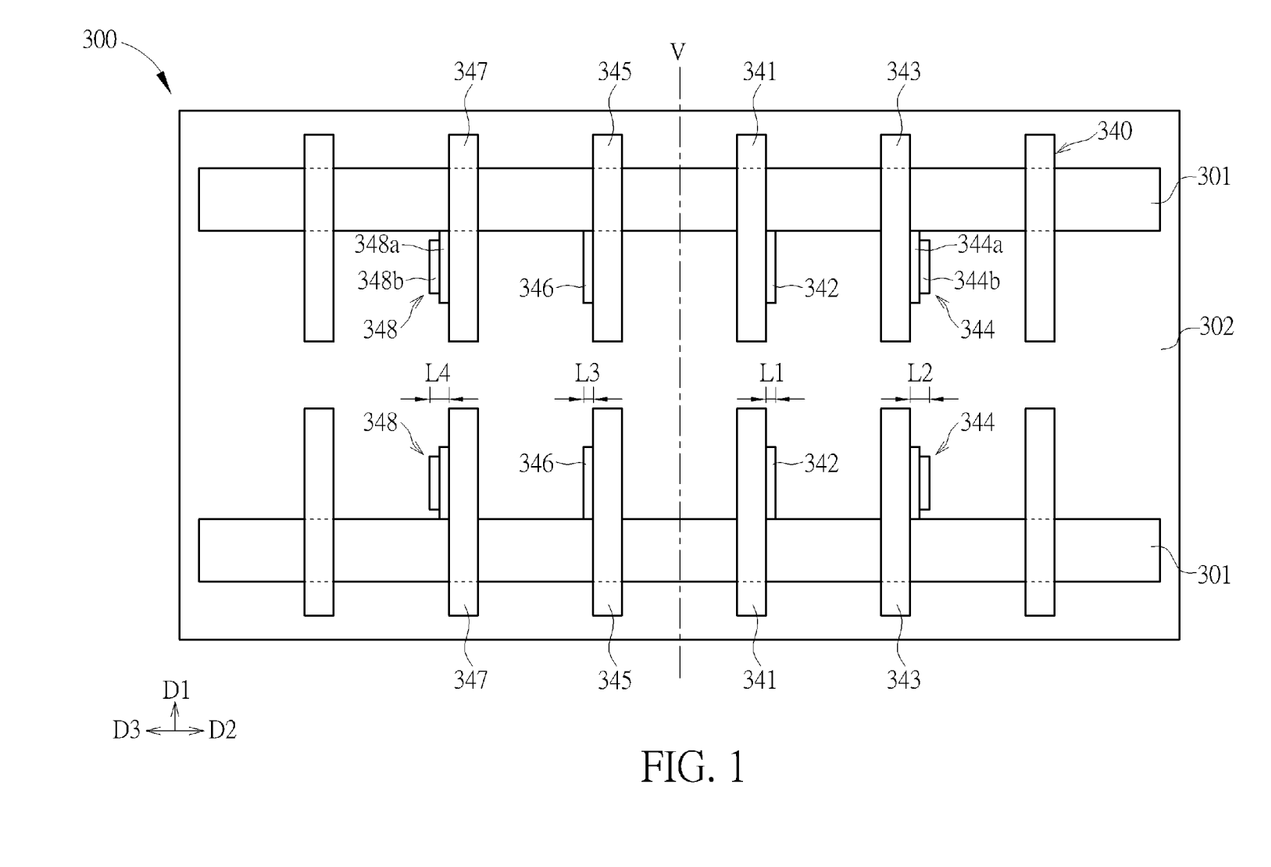
FIG. 1 is a schematic drawing illustrating the method of fabricating the semiconductor device in a starting step.
Figure 2:
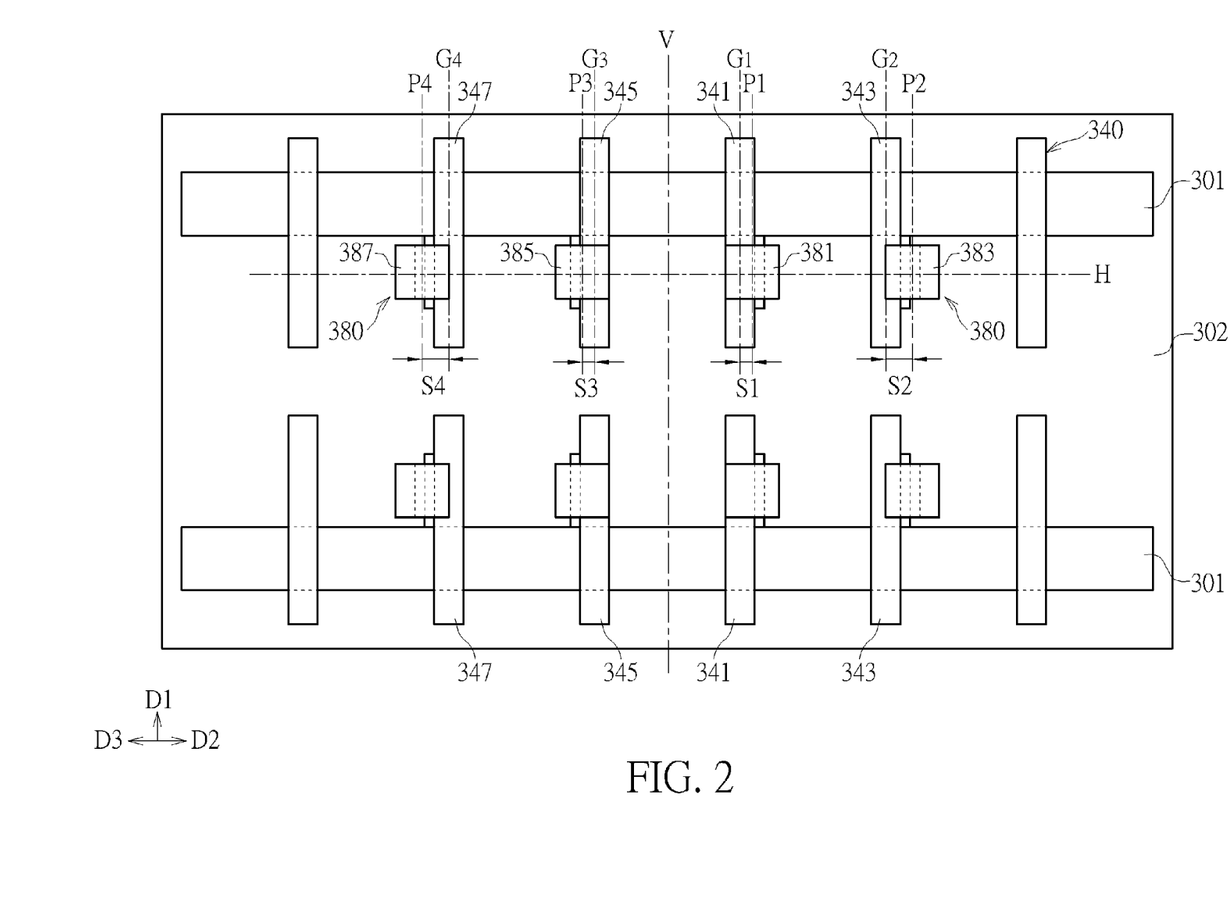
FIG. 2 a schematic drawing illustrating the method of fabricating the semiconductor device after the step of forming plugs.

Please refer to FIG. 1 and FIG. 2. FIG. 1 and FIG. 2 are schematic drawings illustrating a method of fabricating a semiconductor device according to a first embodiment of the present invention. As shown in FIG. 1, a substrate 300 is provided. The substrate 300 may be a silicon substrate, an epitaxial silicon substrate, or silicon on insulation (SOI) substrate, for example. A plurality of gates 340 are formed on the substrate 300.

In this embodiment, at least one fin structure 301 and one insulation layer 302 may be selectively formed on the substrate 300 first. The fin structure 301 may extend in a second direction D2, such as an x direction, and the gate 340 is then formed on the fin structure 301 and straddling the fin structure 301. The fin structure 301 may be formed by a spacer self-aligned double-patterning (SADP) approach, for example. A patterned material (not shown) may be formed on the substrate 300, the patterns of the patterned mask may be transferred to the substrate 300 by an etching process for forming a plurality of trenches (not shown) in the substrate 300, and the patterned mask is removed. Subsequently, the insulation layer 302 is formed in the trenches, a part of the substrate 300 protruding from the insulation layer 302 becomes the fin structure 301, and the insulation layer 302 becomes a shallow trench isolation (STI). In other embodiments, for forming planar transistors without fin structures, at least one shallow trench isolation (not shown) may be formed on a planar substrate (not shown) for defining different active areas (AA, not shown), and gates (not shown) may be formed directly on the planar substrate and straddling the active areas. In some embodiments, the method of forming the gates 340 may include the following steps for example. A plurality of dummy gates (not shown) may be formed on the substrate 300, and a replacement metal gate (RMG) may then be performed for forming the gates 340. However, it should be realized for those skilled in the related field that the gates 340 may also be formed directly on the substrate 300 in some embodiments.

Specifically, the gates 340 are aligned parallel to one another in a first direction D1 (such as a y direction) perpendicular to the second direction D2, and the gates 340 are disposed bilateral symmetric with respect to a symmetry axis V, as shown in FIG. 1. Two outmost gates 340 are used to be dummy gates for example, but not limited thereto. It is worth noting that the gates 341 and 343 disposed between the symmetry axis V and the dummy gate disposed at one side (such as the right side) of the symmetry axis V may additionally include protruding portions 342 and 344. As shown in FIG. 1, the protruding portions 342 and 344 extend from the right sides of the gates 341 and 343 toward the second direction D2 respectively. The protruding portion 342 of the gate 341 extends in the second direction D2, and a length L1 of the protruding portion 342 in the second direction D2 may be about 1-3 nanometers for example. The protruding portion 344 of the gate 343 may have a ladder-shaped structure with a length L2, and the length L2 may be about 2-6 nanometers for example. In detail, the dimension of the protruding portion 342 may range between one fifth of the dimension of the gate 341 and one tenth of the dimension of the gate 341, and the protruding portion 344 includes a first part 344a protruding from a sidewall of the gate 343 and a second part 344b protruding from a sidewall of the first part 344a. The total dimension of the first part 344a may range between one fifth of the total dimension of the gate 343 and one tenth of the total dimension of the gate 343, and the length of the first part 344a in the second direction D2 may be equal to the length L1 of the protruding portion 342 preferably. The total dimension of the second part 344b may range between one tenth of the total dimension of the gate 343 and one twentieth of the total dimension of the gate 343, and the length of the second part 344a in the first direction D1 may be less the length of the first part 344a preferably for avoiding too much stress on the gates 341 and 343.

Additionally, the gates 345 and 347 disposed between the symmetry axis V and the dummy gate disposed at another side (such as the left side) of the symmetry axis V may additionally include protruding portions 346 and 348. As shown in FIG. 1, the protruding portions 346 and 348 extend from the left sides of the gates 345 and 347 toward a third direction D3 away from the second direction D2 respectively. A length L3 of the protruding portion 346 of the gate 345 in the third direction D3 may be about 1-3 nanometers for example. The protruding portion 348 of the gate 347 may have a ladder-shaped structure with a length L4, and the length L4 may be about 2-6 nanometers for example. In detail, the dimension of the protruding portion 346 may range between one fifth of the dimension of the gate 345 and one tenth of the dimension of the gate 345, and the protruding portion 348 includes a first part 348a protruding from a sidewall of the gate 347 and a second part 348b protruding from a sidewall of the first part 348a. The total dimension of the first part 348a may range between one fifth of the total dimension of the gate 347 and one tenth of the total dimension of the gate 347, and the length of the first part 348a in the third direction D3 may be equal to the length L3 of the protruding portion 346 preferably. The total dimension of the second part 348b may range between one tenth of the total dimension of the gate 347 and one twentieth of the total dimension of the gate 347, and the length of the second part 348a in the first direction D1 may be less the length of the first part 348a preferably for avoiding too much stress on the gates 345 and 347.

As shown in FIG. 2, a plurality of plugs 380 (may also be referred as contact plugs) are then formed to be electrically connected to the metal gates. The plugs 380 are formed in an interlayer dielectric layer (ILD) above the gates 340. Specifically, the method of forming the plugs 380 may include the following steps for example. A patterned mask, such as a patterned photoresist layer (not shown), may be formed on the interlayer dielectric layer first, and an etching process, such as a dry etching process, using the patterned photoresist layer as an etching mask is then performed for forming a plurality of contact holes (not shown) penetrating the interlayer dielectric layer and exposing the metal gates of the gates 340. After the step of removing the patterned photoresist layer, a cleaning process may be optionally performed, and surfaces of the contact holes mentioned above may be cleaned by argon (Ar) in the cleaning process for removing residues of the etching process. Subsequently, a silicide process and a contact plug process may be performed sequentially for forming the plugs 380 in the contact holes.

The plugs 380 are formed above the gates 340. The plugs 380 cover the gates 341, 343, 345, and 347 and the protruding portions 342, 344, 346, and 348 in a projective direction perpendicular to the substrate 300 respectively, and the plugs 380 cover a central axis G1 of the gate 341, a central axis G2 of the gate 343, a central axis G3 of the gate 345, and a central axis G4 of the gate 347 preferably. In this embodiment, the plugs 380 are formed on an identical horizontal axis H preferably, and the plugs 380 are also aligned bilateral symmetric with respect to the symmetry axis V, as shown in FIG. 2. Specifically, the plugs 381 and 383 disposed at the right side of the symmetry axis V may have a central axis P1 and a central axis P2 in the first direction D1 respectively. As shown in FIG. 2, the central axes P1 and P2 of the plugs 381 and 383 are shifted from the central axes G1 and G2 of the gates 341 and 343 respectively and shifted toward the second direction D2. However, it is worth noting that the shifting direction of the central axes P1 and P2 of the plugs 381 and 383 is identical to the extending direction of the protruding portions 342 and 344 of the gates 341 and 343. Accordingly, the plugs 381 and 383 may completely cover the gates 341 and 343 and the protruding portions 342 and 344 underneath the plugs 381 and 383. It is worth noting that a shifting distance S2 between the central axis P2 of the plug 383 and the central axis G2 of the gate 343 will be larger than a shifting distance S1 between the central axis P1 of the plug 381 and the central axis G1 of the gate 341. The length L2 and the dimension of the protruding portion 344 of the gate 343 is larger than the length L1 and the dimension of the protruding portion 342 for ensuring that the coverage ratio of the plug 383 on the corresponding gate 343 may be higher than or equal to a specific level, such as about 70%.

Similarly, the plugs 385 and 387 disposed at the left side of the symmetry axis V may have a central axis P3 and a central axis P4 in the first direction D1 respectively. As shown in FIG. 2, the central axes P3 and P4 of the plugs 385 and 387 are shifted from the central axes G3 and G4 of the gates 345 and 347 respectively and shifted toward the third direction D3. However, it is worth noting that the shifting direction of the central axes P3 and P4 of the plugs 385 and 387 is identical to the extending direction of the protruding portions 346 and 348 of the gates 345 and 347. Accordingly, the plugs 385 and 387 may completely cover the gates 345 and 347 and the protruding portions 346 and 348 underneath the plugs 385 and 387. It is worth noting that a shifting distance S4 between the central axis P4 of the plug 387 and the central axis G4 of the gate 347 will be larger than a shifting distance S3 between the central axis P3 of the plug 385 and the central axis G3 of the gate 345. The length L4 and the dimension of the protruding portion 348 of the gate 347 is larger than the length L3 and the dimension of the protruding portion 346 for ensuring that the coverage ratio of the plug 387 on the corresponding gate 347 may be higher than or equal to a specific level, such as about 70%.

Accordingly, the semiconductor device in the first preferred embodiment is formed. In the method of fabricating the semiconductor device of this embodiment, the gates 340 and the plugs 380 are formed sequentially on the substrate 300. The gates 340 and the plugs 380 are aligned bilateral symmetric with respect to the symmetry axis V on the substrate 300. The gates 340 may be formed by a spacer self-aligned double-patterning approach, for example, and the pitch between the gates 340 may be relatively small. The plugs 380 formed subsequently may be formed by a normal photolithography process, and the pitch between the plugs 380 may be relatively large accordingly. In this condition, the position of some of the plugs 380 cannot be corresponding to the position of the gates 340 completely, and the plugs covering the gates 380 will be shifted toward the left side or the right side of the symmetry axis V. However, in this embodiment, the protruding portions 342 and 344 and the protruding portions 346 and 348 are formed at the right side of the gates 341 and 343 disposed at the right side of the symmetry axis V and at the left side of the gates 345 and 347 disposed at the left side of the symmetry axis V respectively in accordance with the shifting directions D2 and D3 and the shifting distances S1, S2, S3, and S4 of the plugs 380 formed subsequently. Therefore, the process window may become larger at the protruding portion 342 of the gate 341, the protruding portion 344 of the gate 343, the protruding portion 346 of the gate 345, and the protruding portion 348 of the gate 347. Accordingly, in the semiconductor device, the coverage ratio of the plugs 380 on the gates 340 may become higher, and the coverage ratio may be higher than or equal to 70% preferably. Additionally, the dimension and the structure of the protruding portions 342, 344, 346, and 348 may be modified in accordance with the shifting distances S1, S2, S3, and S4. For example, the protruding portions 344 and 348 may have a ladder-shape structure respectively, the length L2 of the protruding portion 344 may be larger than the length L1 of the protruding portion 342, and the length L4 of the protruding portion 348 may be larger than the length L3 of the protruding portion 346.

It should be realized for those skilled in the related field that in the present invention, the lengths and the extending directions of the protruding portions of the gates are adjusted in accordance with the positions of the plugs formed subsequently or the actual process conditions, and the protruding portion is not limited to the embodiments described above. For example, in other embodiments, other gates (not shown) may be formed at the right side of the gate 343, and protruding portions (not shown), which may be similar to the protruding portion of the gate 343, having ladder-shaped structures and extending in the second direction D2 may be formed on the gates. The protruding portion may have a length larger than the length L2 of the protruding portion 344 in the second direction D2. For example, the protruding portion may be composed of the first part, the second part, and a third part (not shown), or may be composed of the first part, the second part, the third part, and the fourth part (not shown). Other gates (not shown) may be formed at the left side of the gate 347, and protruding portions (not shown), which may be similar to the protruding portion of the gate 347, having ladder-shaped structures and extending in the third direction D3 may be formed on the gates. The protruding portion may have a length larger than the length L4 of the protruding portion 348 in the third direction D3. For example, the protruding portion may be composed of the first part, the second part, and a third part (not shown), or may be composed of the first part, the second part, the third part, and the fourth part (not shown), but not limited thereto.

The following description will detail the different embodiments of the semiconductor device in the present invention. To simplify the description, the following description will detail the dissimilarities among different embodiments and the identical features will not be redundantly described. Additionally, identical components in each of the following embodiments are marked with identical symbols for comparing between the embodiments.

Figure 3:
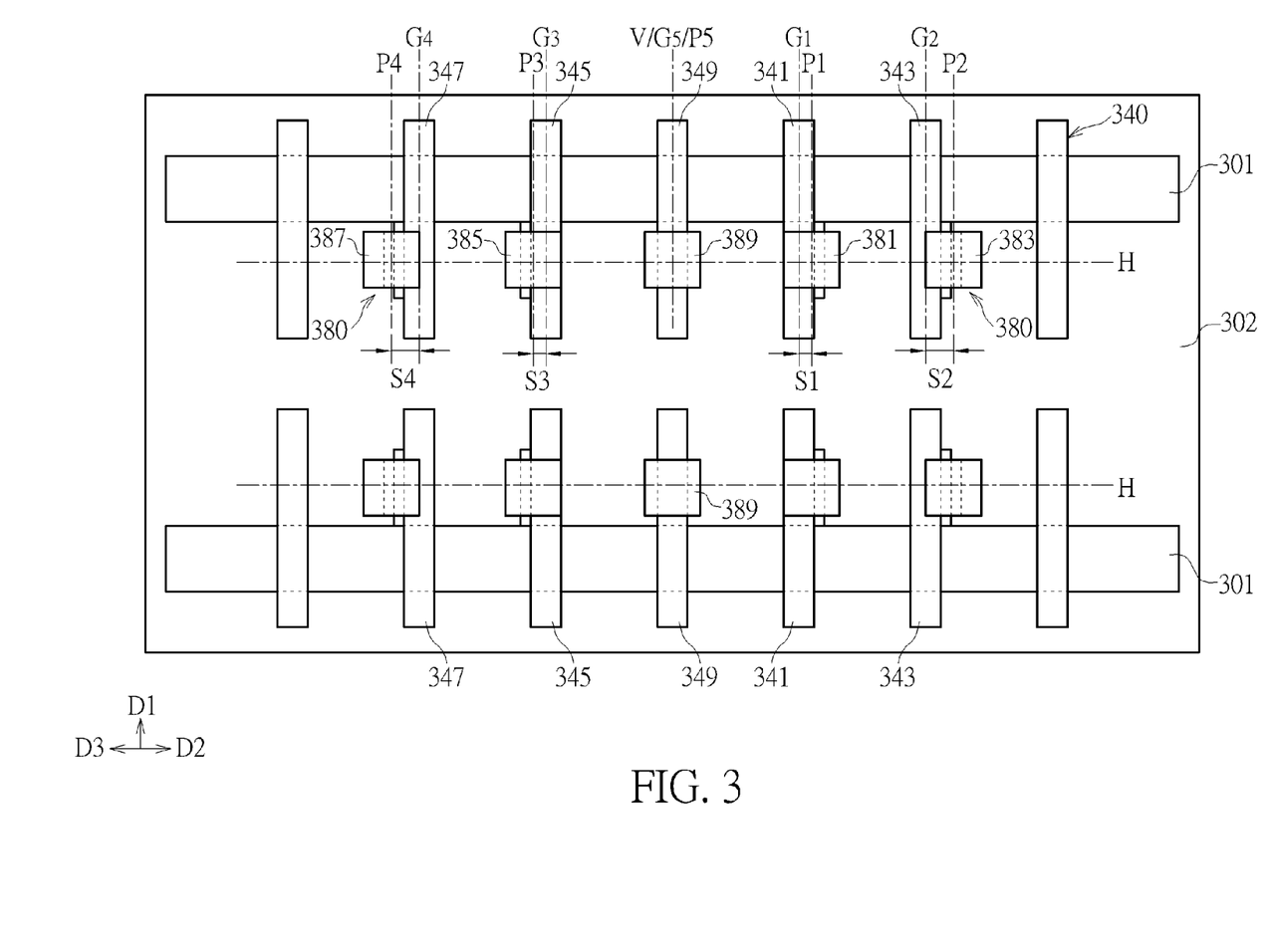
FIG. 3 is a top-view schematic drawing illustrating a semiconductor device according to a second embodiment of the present invention.

Please refer to FIG. 3. FIG. 3 is a top-view schematic drawing illustrating a semiconductor device according to a second embodiment of the present invention. The semiconductor device in this embodiment is substantially similar to the semiconductor device shown in FIG. 2 in the first embodiment and will not be redundantly described. The difference between this embodiment and the embodiment mentioned above is that the semiconductor device of this embodiment further includes a gate 349 disposed on the symmetry axis V and a plug 389 covering the gate 349.

In this embodiment, the gate 349 is disposed between the gate 341 and the gate 345. As shown in FIG. 3, the plug 389 formed above the gate 349 completely covers the gate 349, and a central axis P5 of the plug 389 and a central axis G5 of the gate 349 are both corresponding to the symmetry axis V. In other words, the central axis P5 of the plug 389 overlaps the central axis G5 of the gate 349, and the coverage ratio of the plug 389 on the gate 349 is 100%. Therefore, there is no need to form a protruding portion on the gate 349. The central axes P1 and P2 of the plugs 381 and 383 disposed on the right side of the symmetry axis V will be shifted toward the second direction D2, and the gates 341 and 343 disposed under the plugs 381 and 383 have the protruding portions 342 and 344 extending toward the second direction D2 for ensuring that the coverage ratio of the plugs 381 and 383 covering the gates 341 and 343 respectively may be larger than or equal to 70%. Because the shifting distance S2 between the central axis P2 of the plug 383 and the central axis G2 of the gate 343 is larger than the shifting distance S1 between the central axis P1 of the plug 381 and the central axis G1 of the gate 341, the length of the protruding portion 344 of the gate 343 is larger than the length of the protruding portion 342 of the gate 341, as shown in FIG. 3. Similarly, the central axes P3 and P3 of the plugs 385 and 387 disposed on the left side of the symmetry axis V will be shifted toward the third direction D3, and the gates 345 and 347 disposed under the plugs 385 and 387 have the protruding portions 346 and 348 extending toward the third direction D3 for ensuring that the coverage ratio of the plugs 385 and 387 covering the gates 345 and 347 respectively may be larger than or equal to 70%. Because the shifting distance S4 between the central axis P4 of the plug 387 and the central axis G4 of the gate 347 is larger than the shifting distance S3 between the central axis P3 of the plug 385 and the central axis G3 of the gate 345, the length of the protruding portion 348 of the gate 347 is larger than the length of the protruding portion 346 of the gate 345, as shown in FIG. 3.

Accordingly, in the method of forming the semiconductor device of the present invention, the protruding portions with different dimensions are formed at the left side or the right side of each of the gates in accordance with the shifting directions and the shifting distances of the plugs formed subsequently for being electrically connected to the gates. The coverage ratio of the plugs covering the corresponding gates may be enhanced. The coverage ratio of the plugs may be higher than or equal to 70%, and the process window is also enhanced accordingly. Additionally, in the semiconductor device of the present invention, the lengths and the extending directions of the protruding portions of the gates may also be adjusted in accordance with the shifting distances of the plugs, and the protruding portion may have a ladder-shaped structure and a dimension increasing progressively. For example, the protruding portion may be composed of the first part; be composed of the first part and the second part; be composed of the first part, the second part, and the third part; or be composed of the first part, the second part . . . and the $N^{th}$ part. The first part, the second part . . . and the $N^{th}$ part are smaller than the dimension of the gate for avoiding too much stress on the gate. Additionally, each of the parts mentioned above should have a length at least larger than or equal to the length of the plug in a direction parallel to the gate for ensuring that the coverage ratio of the plug covering the corresponding gate may be higher than or equal to a specific level.

Figure 4:
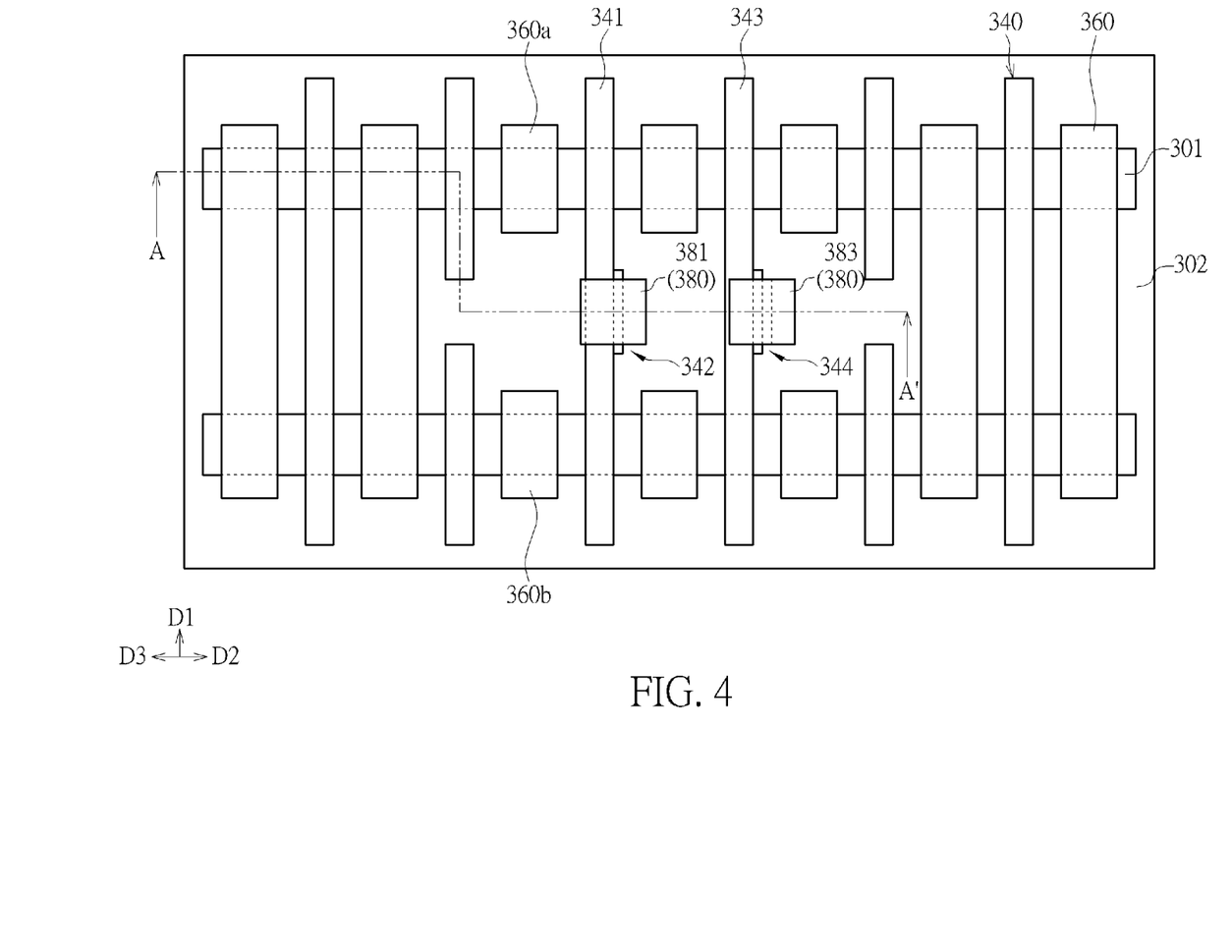
FIG. 4 is schematic drawing illustrating a semiconductor device in an actual circuit layout according to a preferred embodiment of the present invention.
Figure 5:
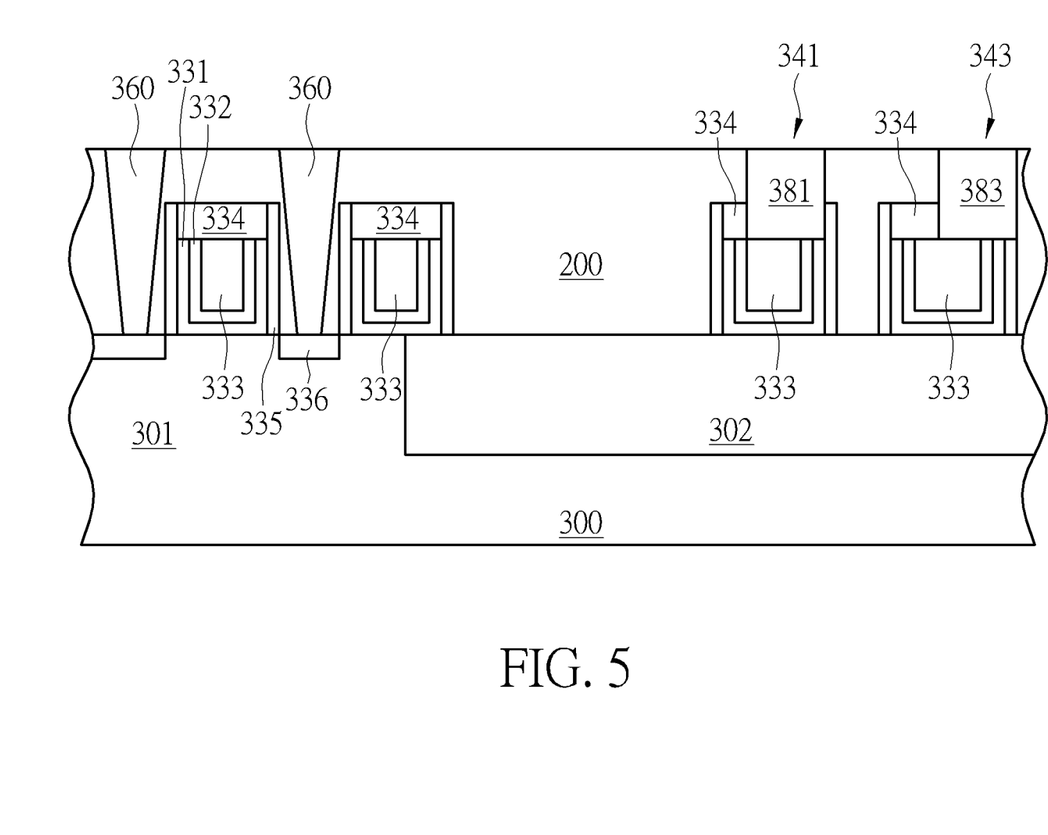
FIG. 5 is a cross-sectional diagram taken along a line A-A' and in FIG. 4.

In addition, it should be realized easily for those skilled in the related field that the application field of the present invention is not limited to the embodiments described above where the plugs are disposed above the gates for describing the embodiments. In other embodiments of the present invention, the allocation relation may be different. For example, the gates may be disposed above the plugs or other required corresponding components, such as contact slots and conductive lines, may be formed for enhancing the coverage ratio and the process window of the manufacturing process. Please refer to FIG. 4 and FIG. 5. FIG. 4 and FIG. 5 are schematic drawings illustrating a semiconductor device in an actual circuit layout according to a preferred embodiment of the present invention. The semiconductor device includes a plurality of the gates 340 straddling the fin structure 301.

As shown in FIG. 5, each of the gates 340 is specifically composed of a high dielectric constant dielectric layer 311, a work function layer 332, a metal conductive layer 333, and a capping layer 334 stacked on the substrate 300 sequentially, a spacer 335 disposed on two sides of the stacked layers, and a source/drain region 336 formed in the fin structure 301. The work function layer 332 may include materials such as tantalum nitride (TaN), titanium nitride (TiN), titanium aluminides (TiAl), or aluminum zirconium (ZrAl), for example. The metal conductive layer 333 may include materials such as tungsten (W) or aluminum (Al) for forming a metal gate of each of the gates 340, for example. The capping layer 334 may include materials such as silicon nitride (SiN) or silicon carbon nitride (SiCN). The spacer 335 may be a single layer or a multiple layer structure selectively, and the spacer 335 may include materials with high etching resistance and great coverage ability, such as high temperature oxide (HTO), silicon nitride, silicon oxide, silicon oxynitride, or HCD-SiN formed by hexachlorodisilane ($Si_2Cl_6$), but not limited thereto.

The semiconductor device further includes a plurality of contact slots 360 electrically connected to source/drain regions 336 of the gates 340 and a plurality of the plugs 380 electrically connected to the metal gates. The plugs 380 and the contact slots 360 are disposed in an interlayer dielectric layer 200. In an embodiment, the contact slots 360 and the plugs 380 may be formed together in the same interlayer dielectric layer 200 by one identical photolithography process, or the plugs 380 may also be formed after the step of forming the contact slots 360 at two sides of the gate 340. The contact slot 360 may be an extending stripe parallel to an extending direction of the gate 340 (i.e. the first direction D1) preferably. In other words, the stripe contact slot 360 in this embodiment extends above the source/drain region 336 for increasing the contact area between the contact slot 360 and the source/drain region 336. However, in an embodiment, for avoiding the influence of the contact slot 360 on the process of forming the plugs 380, at least one slot cut pattern (not shown) may be formed before the step of forming the contact slots 360 in advance for cutting some of the extending stripes of the contact slots 360 into a part 360a and a part 360b (as shown in FIG. 4). It should be realized easily for those skilled in the related field that the layout patterns, and the dimensions, the shapes, and the amounts of the plugs and the contact slots may be further modified in accordance with the process requirements and are not limited to the conditions described above. In some embodiments, a single opening may also be formed selectively.

It is worth noting that the plugs 380 cover the gates 341 and 343, and the plugs 380 are shifted slightly toward the second direction D2. Accordingly, the protruding portions 342 and 344 extending in the second direction D2 are formed on the gates 341 and 343 respectively for ensuring that the coverage ratio of the plugs 381 and 383 covering the gates 341 and 343 may be larger than or equal to a specific level, such as about 70%. Additionally, the shifting distance of the plug 383 is larger than the shifting distance of the plug 381. Therefore, as shown in FIG. 5, the protruding portion 344 of the gate 343 has a ladder-shape structure, and the length and the dimension of the protruding portion 344 is larger than those of the protruding portion 342 for ensuring that the plug 383 contacts the metal gate truly.

Accordingly, in the present invention, the protruding portions with different dimensions are formed at the left side or the right side of each of the gates in accordance with the shifting directions and the shifting distances of the plugs formed subsequently for being electrically connected to the gates. The coverage ratio of the plugs covering the corresponding gates may be enhanced. The coverage ratio of the plugs may be higher than or equal to 70%, and the process window of the plugs may also be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a plurality of gates disposed on the substrate and extending in a first direction, the gates being symmetric to each other with respect to a symmetry axis, wherein the gates comprise a first gate and a second gate both disposed at one side of the symmetry axis, the first gate comprises a first protruding portion and the second gate comprises a second protruding portion, and the first protruding portion and the second protruding portion both extend in a second direction, wherein the first protruding portion of the first gate which is away from the symmetry axis has a greater length than the second protruding portion of the second gate which is closed to the symmetry axis, wherein the first protruding portion has a ladder-shaped structure; and
   a plurality of plugs disposed parallel with one another on the substrate, wherein the plugs comprise a first plug and a second plug, and the first plug and the second plug cover the first gate and the second gate respectively, wherein a central axis of the first plug is shifted from a central axis of the first gate toward the second direction, and a central axis of the second plug is shifted from a central axis of the second gate toward the second direction.

2. The semiconductor device of claim 1, wherein a first pitch between the gates is different from a second pitch between the plugs.

3. The semiconductor device of claim 2, wherein the second pitch between the plugs is larger than the first pitch between the gates.

4. The semiconductor device of claim 1, wherein the plugs are disposed on an identical horizontal axis.

5. The semiconductor device of claim 1, wherein a shifting distance between the central axis of the first plug and the central axis of the first gate is larger than a shifting distance between the central axis of the second plug and the central axis of the second gate.

6. The semiconductor device of claim 1, wherein the first protruding portion comprises a first part and a second part, and a length of the first part is equal to a length of the second protruding portion.

7. The semiconductor device of claim 1, wherein the gates further comprise a third gate and a fourth gate both disposed at an opposite side of the symmetry axis, and the plugs further comprise a third plug and a fourth plug covering the third gate and the fourth gate respectively, wherein a central axis of the third plug is shifted from a central axis of the third gate toward a third direction, a central axis of the fourth plug is shifted from a central axis of the fourth gate toward the third direction, and the third direction is opposite to the second direction.

8. The semiconductor device of claim 7, wherein a shifting distance between the central axis of the third plug and the central axis of the third gate is larger than a shifting distance between the central axis of the fourth plug and the central axis of the fourth gate.

9. The semiconductor device of claim 7, wherein the third gate comprises a third protruding portion extending in the third direction.

10. The semiconductor device of claim 9, wherein the third protruding portion has a ladder-shaped structure.

11. The semiconductor device of claim 9, wherein the fourth gate comprises a fourth protruding portion extending in the third direction, and a length of the fourth protruding portion is less than a length of the third protruding portion.

12. The semiconductor device of claim 11, wherein the third protruding portion comprises a third part and a fourth part, and a length of the third part is equal to the length of the fourth protruding portion.

13. The semiconductor device of claim 1, wherein the gates further comprises a fifth gate, and the plugs further comprises a fifth plug covering the fifth gate, wherein a central axis of the fifth gate overlaps a central axis of the fifth plug.

* * * * *